(12) United States Patent
Gustlin et al.

(10) Patent No.: US 11,762,380 B2
(45) Date of Patent: *Sep. 19, 2023

(54) HARDWARE DEVICE TEMPERATURE CONTROL WITH EXPECTED LIFETIME CALCULATION

(71) Applicant: Cisco Technology, Inc., San Jose, CA (US)

(72) Inventors: Mark A. Gustlin, Campbell, CA (US); Richard J. Wong, Saratoga, CA (US); Rakesh Chopra, Menlo Park, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/813,692

(22) Filed: Jul. 20, 2022

(65) Prior Publication Data

US 2022/0357736 A1 Nov. 10, 2022

Related U.S. Application Data

(63) Continuation of application No. 16/723,882, filed on Dec. 20, 2019, now Pat. No. 11,429,093.

(51) Int. Cl.
*G05B 23/02* (2006.01)
*H05K 7/20* (2006.01)

(52) U.S. Cl.
CPC ..... *G05B 23/0283* (2013.01); *G05B 23/0232* (2013.01); *H05K 7/20836* (2013.01)

(58) Field of Classification Search
CPC ............ G05B 23/0232; G05B 23/0283; H05K 7/20836

USPC ......................................................... 702/184
See application file for complete search history.

(56) References Cited

U.S. PATENT DOCUMENTS

| 9,842,780 | B2 * | 12/2017 | Lee | ................ | H01L 21/76224 |
| 11,429,093 | B2 * | 8/2022 | Gustlin | ............. | G05B 23/0289 |
| 2014/0129063 | A1 * | 5/2014 | Clark | ..................... | G06F 17/00 |
| | | | | | 701/22 |

OTHER PUBLICATIONS

Mino et al., JP2009257953A, "Management device", Date publish: Nov. 5, 2009 (Year: 2009).*
Mladenovic et al., DE102017203836A1, "Method And System For Determining An Expected Life Of An Electrical Equipment", Date publish: Sep. 13, 2018 (Year: 2018).*

* cited by examiner

*Primary Examiner* — John H Le
(74) *Attorney, Agent, or Firm* — Patterson + Sheridan, LLP

(57) ABSTRACT

Embodiments herein describe coupling traditional fan and shaper control along with aggregated knowledge of the temperature history of a hardware device to optimally manage the temperature of the hardware device to preserve its expected life while also providing the lower power, best performing solution possible. In one embodiment, a cooling application manages the expected life by trading off performance and power versus temperature to achieve a desired (or accepted) lifetime. In one embodiment, the cooling application calculates a historical temperature value for the hardware device which is then used to determine the expected life of the hardware device.

20 Claims, 5 Drawing Sheets

HARDWARE DEVICE TEMPERATURE CONTROL WITH EXPECTED LIFETIME CALCULATION

CROSS-REFERENCE TO RELATED APPLICATIONS

This application is a continuation of co-pending U.S. patent application Ser. No. 16/723,882 filed Dec. 20, 2019. The aforementioned related patent application is herein incorporated by reference in its entirety.

TECHNICAL FIELD

Embodiments presented in this disclosure generally relate to cooling a hardware device by calculating the expected life of the device using historical temperature measurements.

BACKGROUND

High end routing and switching faces difficult cooling challenges which are the single biggest obstacle to supporting higher throughput systems. Application specific integrated circuits (ASICs) are the backbones of network devices and concentrate the heat in a relatively small area. Advanced heatsinks, fans, and other methods are used to cool the ASICs but are often unable to cool the worst case traffic loads continuously and maintain the desired long term ASIC reliability without throttling the data traffic through the ASIC.

ASIC reliability depends on the design of the device, and the temperature at which it operates. When operating at lower temperatures, the ASIC has a longer life expectancy (>>10 years). However, when the same ASIC operates at a very high temperature, its lifetime can be much less than 10 years. Traditional temperature control algorithms run the fan speed and throttle data traffic based solely on the ambient temperature, or based on ambient temperatures plus ASIC junction temperatures.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

Figure 1:
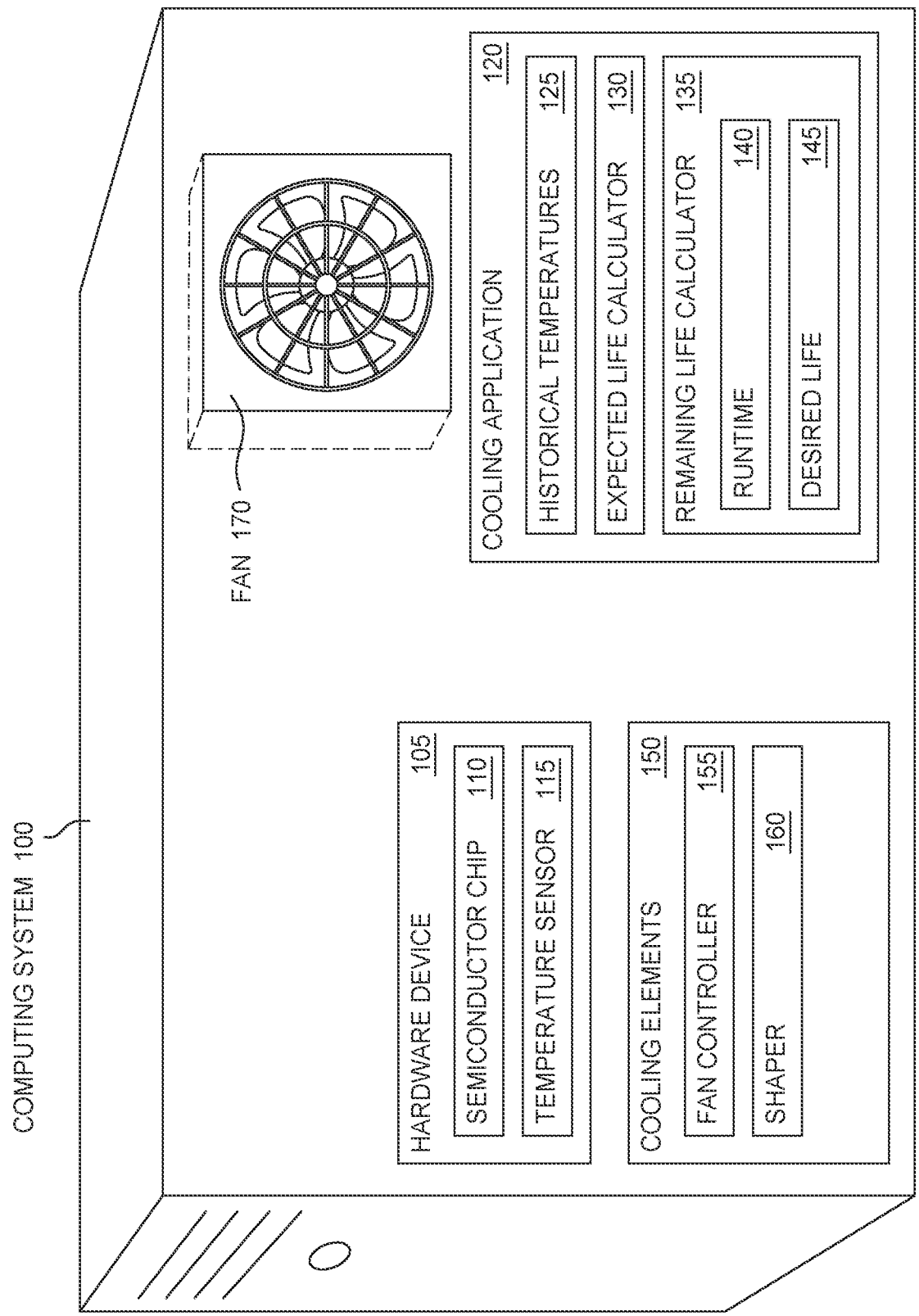
FIG. 1 illustrates a computing system for cooling a hardware device, according to one embodiment.

One embodiment presented in this disclosure is a method that includes determining an expected life of a hardware device in a computing system based on a plurality of historical temperature measurements and a current temperature measurement, comparing the expected life to a desired remaining life of the hardware device, where the desired remaining life is based on a desired lifespan and a total runtime of the hardware device, and, upon determining the expected life is less than the desired remaining life, decreasing the temperature of the hardware device by changing an operating parameter of a cooling element in the computing system. The method also includes determining the desired remaining life by subtracting the total runtime from the desired lifespan.

Another embodiment presented in this disclosure is a non-transitory computer readable medium having program instructions embodied therewith, the program instructions executable by a processor to perform an operation. The operation includes determining an expected life of a hardware device in a computing system based on a plurality of historical temperature measurements and a current temperature measurement, comparing the expected life to a desired remaining life of the hardware device, wherein the desired remaining life is based on a desired lifespan and a total runtime of the hardware device, and, upon determining the expected life is less than the desired remaining life, decreasing the temperature of the hardware device by changing an operating parameter of a cooling element in the computing system. The operation also includes determining the desired remaining life by subtracting the total runtime from the desired lifespan.

Another embodiment presented in this disclosure is a cooling system that includes a physical cooling element and a cooling application configured to determine an expected life of a hardware device based on a plurality of historical temperature measurements and a current temperature measurement, compare the expected life to a desired remaining life of the hardware device where the desired remaining life is based on a desired lifespan and a total runtime of the hardware device, and, upon determining the expected life is less than the desired remaining life, decrease the temperature of the hardware device by changing an operating parameter of a cooling element in the computing system. The cooling application is also configured to determine the desired remaining life by subtracting the total runtime from the desired lifespan.

Example Embodiments

Embodiments herein describe coupling a traditional fan and shaper control along with aggregated knowledge of the temperature history of a hardware device (e.g., a semiconductor chip) to optimally manage the temperature of the hardware device to preserve its expected life while also providing a low power, better performing solution. In one embodiment, a cooling application manages the expected life by trading off performance and power versus junction temperature to achieve a desired (or accepted) lifetime.

In one embodiment, the cooling application calculates a historical temperature value (e.g., an effective junction temperature) for the hardware device which is then used to determine the expected life of the hardware device. The expected life is an estimate of how long the hardware device operates before likely experiencing a hardware failure that would prevents the device from operating. The cooling application can also track the actual runtime of the hardware device (e.g., how many hours the device has already run) and subtract this value from a desired lifetime of the hardware device (e.g., 10 years) to yield a desired remaining life of the hardware device (e.g., the amount of time the system administrator wants the device to continue to operate). If the expected life is less than the desired remaining life (i.e., the hardware device is expected to fail before the desired remaining life if the historical temperature value does not change), the cooling application can take an action to decrease the temperature of the hardware device such as increasing fan speed or decreasing the amount of data flowing through the hardware device using shapers.

In contrast, if the cooling application determines the expected life is greater than the desired remaining life (i.e., the hardware device is expected to last longer than the desired remaining life), the cooling application can take an action to increase the temperature of the hardware device such as decreasing fan speed or increasing the amount of data flowing through the hardware device. For example, the hardware device may be scheduled for replacement on after the desired remaining life expires, so increasing the temperature can reduce operating costs (e.g., lower power consumption) and increase the data throughput while ensuring the expected life meets the desired remaining life.

FIG. 1 illustrates a computing system 100 for cooling a hardware device 105, according to one embodiment. The hardware device 105 can be any device that generates heat when operating the computing system 100. In this example, the hardware device 105 includes a semiconductor chip 110 (e.g., a central processing unit, graphics processing unit, field programmable gate array, ASIC, memory chip (DRAM/SRAM), and the like). In another embodiment, the hardware device 105 may be a component such as a hard drive, memory module, adapter card, motherboard, and the like. In any case, the hardware device 105 includes a temperature sensor 115 (or a network of temperature sensors) for measuring a temperature of the device 105. For example, the temperature sensor 115 may measure the junction temperature of the semiconductor chip 110 which is the highest operating temperature of the actual semiconductor in the chip 110 and is often higher than the ambient temperature within the computing system 100. If the hardware device 105 is a component such as a hard drive, the temperature sensor 115 may measure the temperature within the hard drive or a specific element in the hard drive.

The computing system 100 includes a cooling application 120 for controlling cooling elements 150 that cool the hardware device 105. As shown, the cooling application 120 (e.g., a software application) contains historical temperatures 125 of the hardware device 105 (e.g., the junction temperature over the last two weeks of operation), an expected life calculator 130, and a remaining life calculator 135. The expected life calculator 130 uses the historical temperatures 125 along with the current operating conditions, to predict or estimate the expected life of the hardware device 105.

The remaining life calculator 135 tracks a runtime 140 of the hardware device 105 (i.e., how long the hardware device 105 has been operating) and subtracts this value from a desired life 145 of the hardware device 105. For example, a system administrator may plan on replacing the hardware device 105 (or the entire computing system 100) in ten years after it is installed, which is the desired life 145 of the hardware device 105. If the hardware device 105 has already been in operation for four years, then the desired remaining life of the hardware device 105 is six years.

As described in more detail below, the cooling application 120 can use the expected life determined by the expected life calculator 130 and the desired remaining life determined by the remaining life calculator 135 to control the cooling elements 150. By cooling the hardware device 105, the cooling application 120 can increase the expected life of the hardware device 105. However, by providing less cooling to the hardware device 105, the cooling application 120 decreases the expected life of the hardware device 105, but can also save power and improve performance of the computing system 100.

The cooling elements 150 include a fan controller 155 and a shaper 160 (e.g., a packet per second (PPS) shaper or a bandwidth (BW) shaper). The fan controller 155 controls the speed of the fan 170 which provides an air flow that cools the hardware device 105. Increasing or decreasing the speed of the fan 170 can decrease and increase the temperature of the semiconductor chip 110 (assuming the workload on the chip 110 remains the same). The shaper 160 controls the workload of the hardware device 105. By changing the PPS or BW (or other traffic control mechanism such as a policer or meter), the shaper 160 can reduce the workload of the semiconductor chip 110 which decreases its temperature. While FIG. 1 illustrates two different cooling elements 150, the embodiments herein can use any type of cooling element (e.g., liquid cooling systems). Further, the computing system 100 may include fewer, or more, cooling elements 150 than the one shown. For example, the space in the computing system 100 may be limited which means the computing system 100 includes the shaper but not the fan 170. Further, for high performance applications, the computing system 100 may include an array of fans.

The computing system 100 can be a server, network device (e.g., switch or router), mobile device (e.g., smartphone, tablet, or laptop), desktop computer, data center, or cloud computing site. Generally, the computing system 100 can be any device or distributed computing system that has heat generating hardware devices 105 that are cooled using cooling elements 150.

Figure 2:
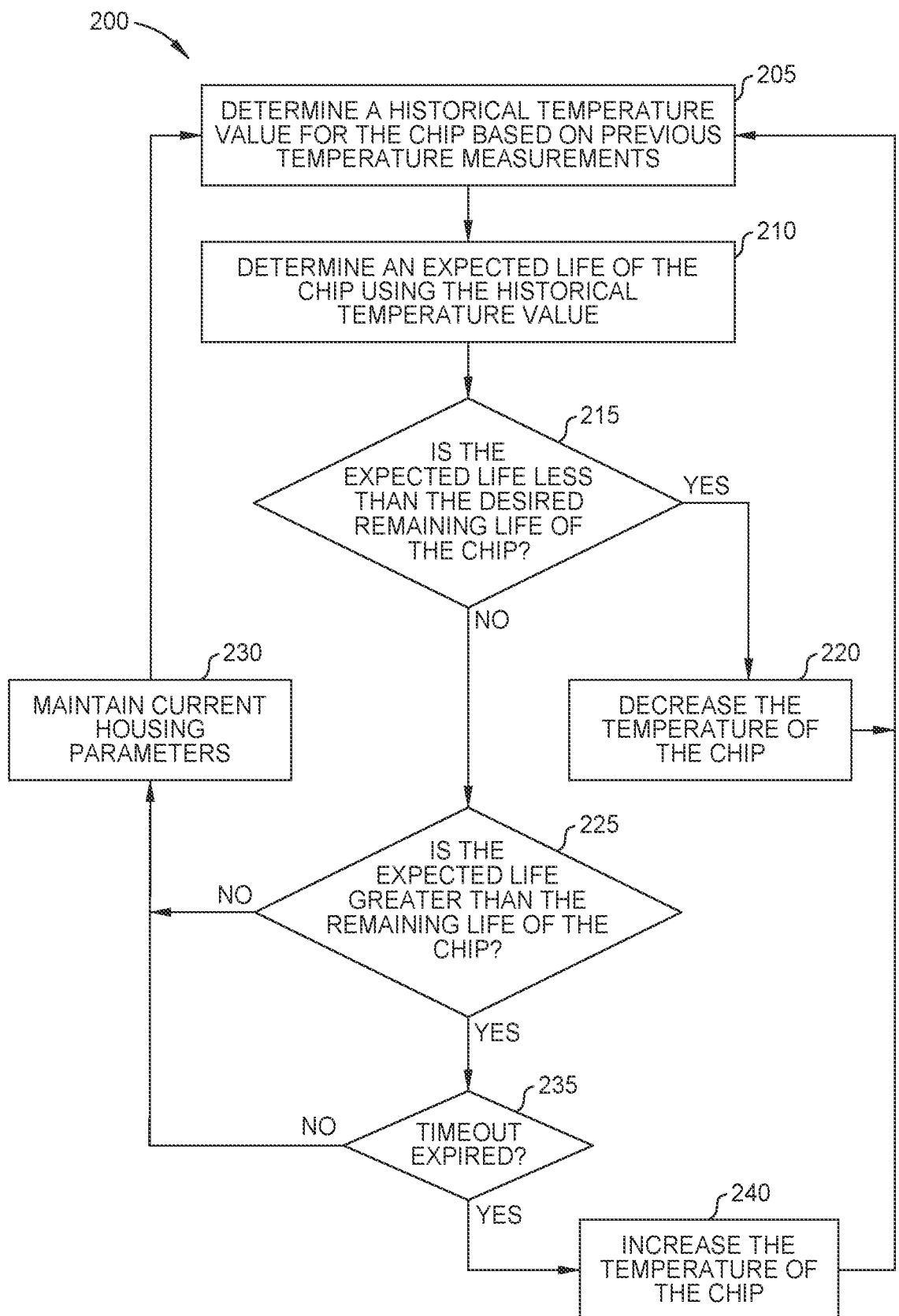
FIG. 2 is a flowchart for cooling a hardware device by determining an expected life of the device using historical temperature measurements, according to one embodiment.

FIG. 2 is a flowchart of a method 200 for cooling a semiconductor chip by determining an expected life of the device using historical temperature measurements, according to one embodiment. At block 205, the cooling application determines a historical temperature value for a semiconductor chip. While the method 200 specifically describes cooling a semiconductor chip, the method 200 can be applied to any hardware device.

In one embodiment, the historical temperature value is an effective junction temperature derived from a plurality of historical temperature measurements and the current measurements captured over a predefined time window. That is, the effective junction temperature may be derived from all the junction temperatures measured in the last year of operation which are used in a calculation with the current measurements captured in the current window. For example, the cooling application may receive a temperature measurement every minute and use previous temperature measurements to calculate the historical temperature value. While the temperature of the semiconductor chip can be directly measured using one or more temperature sensors, in other embodiments, the current temperature of the chip can be estimated by the performance parameters of the chip such as its current workload and power consumption.

The junction temperature can be calculated using a single sensor or multiple sensors across an ASIC (e.g., single sensor plus offset, average of sensors, average of sensor plus an offset, or maximum sensor plus offset). In one embodiment, the cooling application tracks the junction temperature of an ASIC across the die and executes the lifetime algorithm within portions of the die. For example, the top part of the die may have been idle for 5 years, while the bottom part of the die has been hot for 5 years. The lifetime of the top part of the die could be calculated uniquely from the bottom part.

At block 210, the expected life calculator determines an expected life of the chip using the historical temperature value. That is, rather than using the current temperature of the semiconductor chip, the expected life is calculated is based on a plurality of historical temperature measurements as represented by the historical temperature value. Using historical measurements enables the cooling application to benefit from times where the semiconductor chip was cooler, and thus, experiencing less wear and tear than at a current temperature. For example, assume that for 45 minutes of the last hour the semiconductor chip had a temperature of 100 degrees Celsius (C) but a temperature of 115 degrees C. in the most recent 15 minute period. If the optimal temperature to achieve a ten year lifespan of the chip is 110 degrees C., then for the 45 minutes time period additional time was added to the lifespan of the chip since the temperature was below 110 degrees C. In contrast, life was removed from the lifespan of the chip during the 15 minute period since the temperature was above 110 degrees C. Thus, over the sixty minute period, the lifespan of the semiconductor chip actually increased. If this pattern repeated, the chip would last longer than the ten year lifespan.

Calculating the expected life using the historical temperature value enables the cooling application to recognize (or gain credit) for times when the temperature was below the optimal temperature which can be used to operate the semiconductor chip at temperatures above the optimal temperature while still obtaining the desired lifespan (e.g., ten years). Put differently, rather than relying on the current temperature to calculate the expected life of the semiconductor chip, the historical temperature value is used which enables the cooling application to have a better historical perspective of the estimated remaining life of the semiconductor chip. Using the example above, when using the historical temperature value of 103.75 C, the expected life exceeds 10 years, but if the current temperature were used instead (e.g., 115 C), the expected life would be less than 10 years. In general, the expected life is an estimate of the amount time the hardware device is likely to last before failing and needs to be replaced. The details for determining the expected life are discussed in more detail in FIG. 5.

At block 215, the cooling application determines whether the expected life is less than the desired remaining life of the chip. The desired remaining life is the desired lifespan of the chip after considering the amount of time the chip has already been operating (i.e., the runtime of the chip). In one embodiment, the remaining life calculator determines the desired remaining life by subtracting the desired lifespan of the chip by the total runtime. For example, a system administrator may inform the cooling application she wants the chip to operate for fifteen years. The remaining life calculator can continually track the runtime of the chip and subtract this value from the desired lifespan provided by the system administrator. The resulting value (i.e., the desired remaining life) is the target or goal the cooling application uses to cool the semiconductor chip. Stated differently, the cooling application cools the chip so that the expected life matches the desired remaining life.

If the expected life is less than the desired remaining life, this means that the cooling application predicts that the chip will likely fail prematurely (i.e., the chip will likely fail before the system administrator has planned on it failing). If so, the method 200 proceeds to block 220 where the cooling application decreases the temperature of the chip. That is, the cooling application instructs one or more cooling elements to reduce the temperature of the semiconductor chip, thereby improving its expected life. For example, the cooling application may increase the fan speed or throttle back the workload on the semiconductor chip. This cools the chip which means the next time the expected life is calculated (i.e., when blocks 205 and 210 are repeated), the expected life will increase (although the change in the expected life is slower since a historical temperature value is used rather than only the current temperature). In one embodiment, the method 200 repeats at a predefined interval (e.g., every minute).

However, if the expected life is not less than the desired remaining life, this means expected life is equal to, or greater than, the desired remaining life. In that case, the method 200 proceeds to block 225 where the cooling application determines whether the expected life is greater than the desired remaining life. If not, this means the expected life matches the desired remaining life, thereby indicating the cooling application is optimally controlling the cooling of the chip so that it is expected to fail at exactly the time planned on by the system administrator. Thus, the method 200 proceeds to block 230 where the cooling application maintains the current cooling parameters (e.g., keeps the fan at the same speed and does not change any shaper settings). Assuming the expected life does not change, the cooling application could remain at block 230 and the chip will have a lifespan that matches the one desired by the system administrator. However, since the heat generated by the chip is typically not constant, the expected life changes when the method 200 repeats at predefined intervals.

If at block 225 the cooling application instead determines the expected life is greater than the remaining life, this means the chip will likely fail after the desired lifespan set by the system administrator (i.e., the chip will likely last longer than the system administrator planned on). While the cooling application can maintain the current cooling parameters in this situation, doing so means the computing system does not take advantage of power savings that can be achieved by reducing the fan speed or performance improvements by increasing the workload on the semiconductor chip. Put differently, system administrator may plan on replacing the component in 15 years regardless of whether the chip is functional and has remaining life (e.g., because the semiconductor chip is outdated), and thus, the system administrator may rather have the power savings and improved performance than a longer lifespan of the chip.

When the expected life is greater than the desired remaining life, the method 200 proceeds to block 235 where the cooling application determines whether a timeout has expired. The timeout is a hysteresis value that prevents the cooling application from constantly changing the parameters of the cooling elements. For example, at Time A, the cooling application may determine to decrease the temperature of the chip at block 220, and after doing so for a certain time period, the expected life is now greater than the desired remaining life. Rather than immediately controlling the cooling elements to save power and improve performance, the cooling application first checks if the timeout value has been met at block 235. For example, the timeout value may dictate that the cooling application waits two minutes after determining the expected life is greater than the desired remaining life before permitting it to continue. The timeout value prevents the cooling application from constantly changing the parameters on the cooling elements to increase and decreases the temperature of the chip. Constantly changing fan speed, for example, can result in a significant increase on the wear and tear on the fan which might cause it to fail. This is especially true for mechanical cooling elements.

If the timeout value has not expired, the method 200 proceeds to block 230 where the current cooling parameters are maintained. However, if the timeout value has expired, the method 200 proceeds to block 240 where the cooling application controls the cooling elements to increase the temperature of the chip. Doing so can result in power savings and improved performance. For example, the cooling application can decrease the fan speed, which saves power, or reduce the shaper, which can increase the workload and improve performance. The cooling application can of course perform a combination of these actions. In any case, the cooling application increases the temperature of the chip which then reduces its expected life (as the method 200 repeats) to be closer to the desired remaining life.

Figure 3:
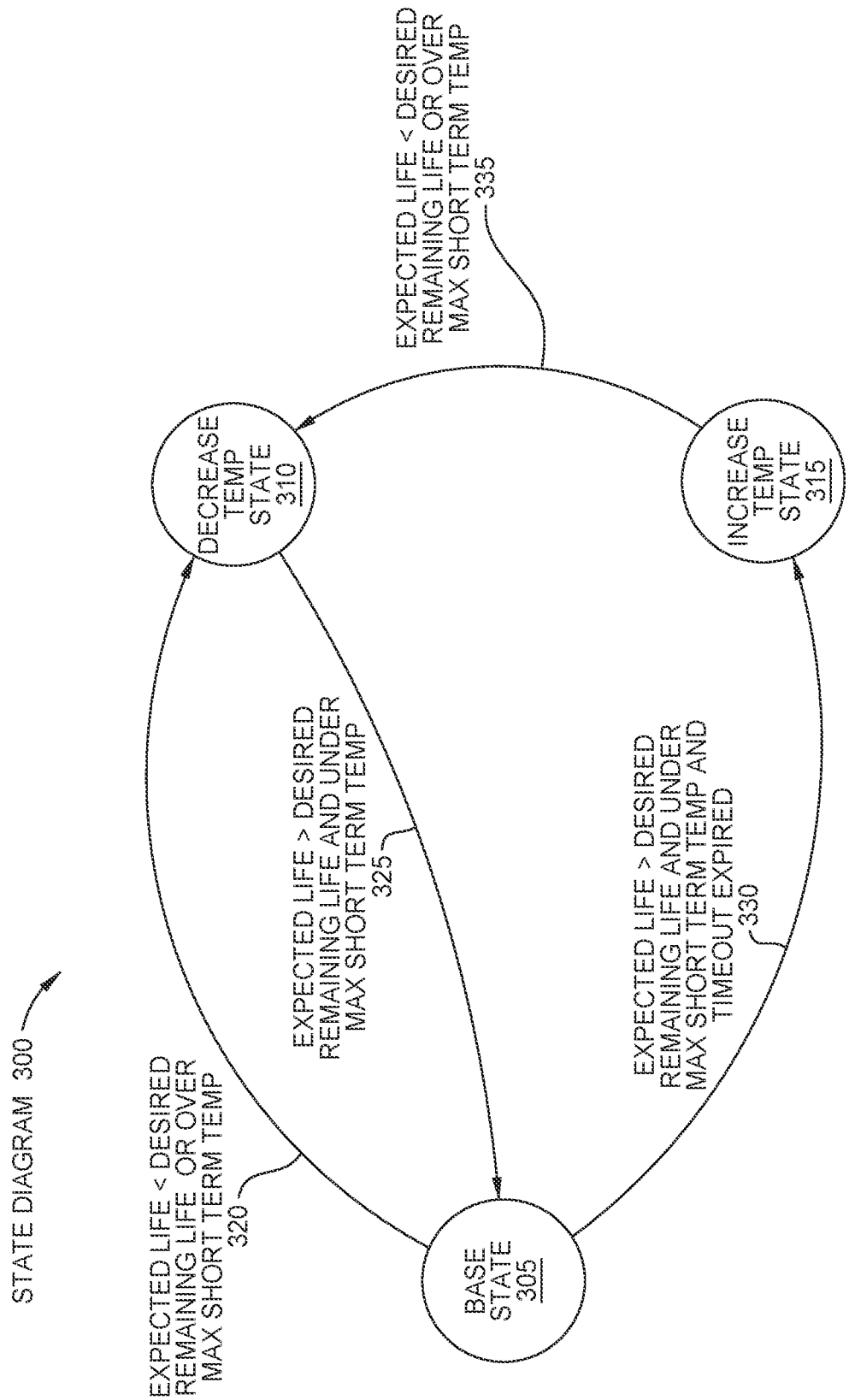
FIG. 3 is a state diagram used for controlling cooling elements that cool a hardware device, according to one embodiment.

FIG. 3 is a state diagram 300 used for controlling cooling elements that cool a hardware device, according to one embodiment. In one embodiment, the state diagram 300 represents the various states of the cooling application and the criteria for switching between those states. In this example, the state diagram 300 includes many of the same criteria used in the method 200 shown in FIG. 2 along with additional (optional) features.

The state diagram 300 includes a base state 305, a decrease temperature state 310, and an increase temperature state 315. When in the base state 305, the cooling application maintains the current cooling parameters (similar to block 230 of method 200). For example, after booting the computing system, the cooling application may enter the base state 305. There, the cooling application may use default cooling parameters (e.g., fan speed set at 30% and the shaper is deactivated) or may deactivate all cooling elements for a predetermined time period (e.g., until one hour of operation). During the time period (e.g., a grace period) the cooling application can monitor and control the short term junction temperature requirements until history data is accumulated. Later, the cooling application can begin to control the cooling system based on the expected life calculations. However, in other embodiments, the cooling application may nonetheless calculate the expected life once the computing system boots without using a grace period.

The arrow 320 illustrates the criteria used to move from the base state 305 to the decrease temperature state 310. This criteria includes either the expected life is less than the desired remaining life or the current temperature of the hardware device exceeds the maximum short term temperature of the device. Determining whether the expected life is less than the desired remaining life can be performed using the techniques described at block 215 of the method 200. As mentioned in method 200, the expected life is calculated using a historical temperature value. However, because there may not be any historical temperature measurements at startup, the cooling application may use a start buffer that provides some historical measurements before new temperature measurements can be used. Alternatively, until sufficient historical measurements are obtained, the cooling application may not calculate the expected life of the chip.

The cooling application can determine whether the hardware device exceeds the maximum short term temperature of the device by comparing the current temperature of the hardware device (e.g., a junction temperature as provided by a sensor or a network of sensors) to a predefined maximum short term temperature set by the manufacture of the hardware device. For example, if the hardware device is a semiconductor chip, the manufacture may indicate that if the junction temperature exceeds 125 degrees C., the chip is not guaranteed to function as designed. Thus, regardless of the expected life, if the current temperature exceeds 125 C, the cooling application switches from the base state to the decrease temperature state 310.

When in the decrease temperature state 310, the cooling application can perform any of the control techniques described at block 220 of method 200 to decrease the temperature of the hardware device. In one embodiment, the cooling application determines the amount to cool the hardware device using a proportional controller. In one embodiment, the proportional controller sets the parameters of the cooling elements by comparing the current temperature of the hardware device to a temperature that results in the desired lifetime of the hardware device. For example, assume that a semiconductor chip is designed such that if operated constantly at 110 degrees C., it has a lifespan of 10 years. If the current temperature is 120 degrees C., the proportional controller sets more aggressive cooling parameters than if the current temperature is 115 degrees C. (which is much closer to the desired temperature of 110 degrees C.). Thus, the manner in which the cooling application sets the parameters of the cooling elements can be done in proportion to the difference between the temperature that yields the desired lifespan and the current temperature of the hardware device.

The arrow 325 indicates the criteria that used to determine when the cooling application moves from the decrease temperature state 310 back to the base state 305. In this example, the expected life must be greater than the desired remaining life and the current temperature is below the maximum short term temperature. For example, when at the base state 305 and the decrease temperature state 310, the cooling application can continue to recalculate the expected life as additional temperature measurements are received (e.g., every minute). Thus, as the cooling action performed at the state 310 begin to cool the hardware device, the expected life begins to increase until it matches or exceeds the desired remaining life. However, if the cooling action does not reduce the temperature of the hardware device, the cooling application may decide to take a more aggressive cooling action—e.g., increasing the fan speed, activating additional fans, or further throttling the workload of the hardware device. For example, the workload may have ramped up in the hardware device which means its temperature may remain the same (or increase) despite the increased cooling provided by the cooling elements when operating in the decrease temperature state 310.

The arrow 330 indicates the criteria used to determine when the cooling application should switch from the base state 305 to the increase temperature state 315. As shown, the expected life must be greater than the desired remaining life, the current temperature of the hardware device must be below the maximum short term temperature, and the timeout expired. That is, in this example, all three of these criteria must be met to switch to the increase temperature state 315. Once in the state 315, the cooling application can perform any of the techniques described at block 240 of method 200 to increase the temperature of the hardware device which may reduce the expected life but provide power savings and performance improvements.

At the increase temperature state 315, the cooling application can continue to recalculate the expected life of the hardware device as additional temperature measurements are received. The arrow 335 indicates the criteria the cooling application can use to switch from the increase temperature state 315 to the decrease temperature state 310. The cooling application switches to the decrease temperature state 310 when either the expected life is less than the desired remaining life or the current temperature exceeds the max short term temperature. In this embodiment, the criteria for switching from the base state 305 to the decrease temperature state 310 is the same as the criteria for switching from the increase temperature state 315 to the decrease temperature state 310. In the state diagram 300, there is no criteria for the cooling application to switch from the increase temperature state 315 directly to the base state 305.

While the state diagram 300 uses a timeout value before switching to the increase temperature state 315 (which prevents rapidly switching from the decrease temperature state 310 to the increase temperature state 315), this is not a requirement. For example, if cooling is performed using solely software cooling elements, constantly changing the parameters of these cooling elements may not have any drawbacks unlike with constantly changing parameters of a mechanical cooling element. Additionally, the arrow 335 may include a timeout value for switching from the increase temperature state 315 to the decrease temperature state 310 which may be the same or different as the timeout value used when switching from the base state 305 to the increase temperature state 315. The cooling application may have to wait until the timeout has expired (which may start running once the cooling application switches to the increase temperature state 315) before it can switch from state 315 to state 310 (assuming one of the other two criteria is also satisfied). However, using a timeout value for the arrow 335 may be less desirable since if the current temperature is above the max short term temperature, the hardware device may be damaged while waiting for the timeout to expire. In one embodiment, the timeout value is used, but can be overridden if the currently measured temperature exceeds the max short term temperature.

The cooling application can also use the proportional controller to set the parameters of the cooling elements when operating in the increase temperature state 315. For example, the cooling application may decrease the fan speed more aggressively if the current temperature is ten degrees below the desired temperature rather than only five degrees. Also, because the workload on the hardware device can vary, the workload may have decreased in the hardware device which results in the temperature not increasing (or decreasing further). In that scenario, the cooling application may further reduce the parameters of the cooling parameters to capture additional power savings and improved performance.

While the state diagram 300 describes cooling a single hardware device (e.g., one ASIC), the cooling application can execute multiple cooling algorithms for different hardware devices. That is, the cooling application can track the expected life for multiple hardware devices. In one embodiment, the cooling application can use a secondary algorithm to aggregate the results from the different hardware devices and decide how to control the centralized cooling elements—e.g., fans that are tasked with cooling all the hardware devices.

Moreover, the cooling application can include over-ride policies for determining when the cooling application should take an action that may contradict the state diagram. For example, if one of the fans in the computing system fails, an over-ride policy may indicate that the remaining fan or fans should be run at max power.

Figure 4:
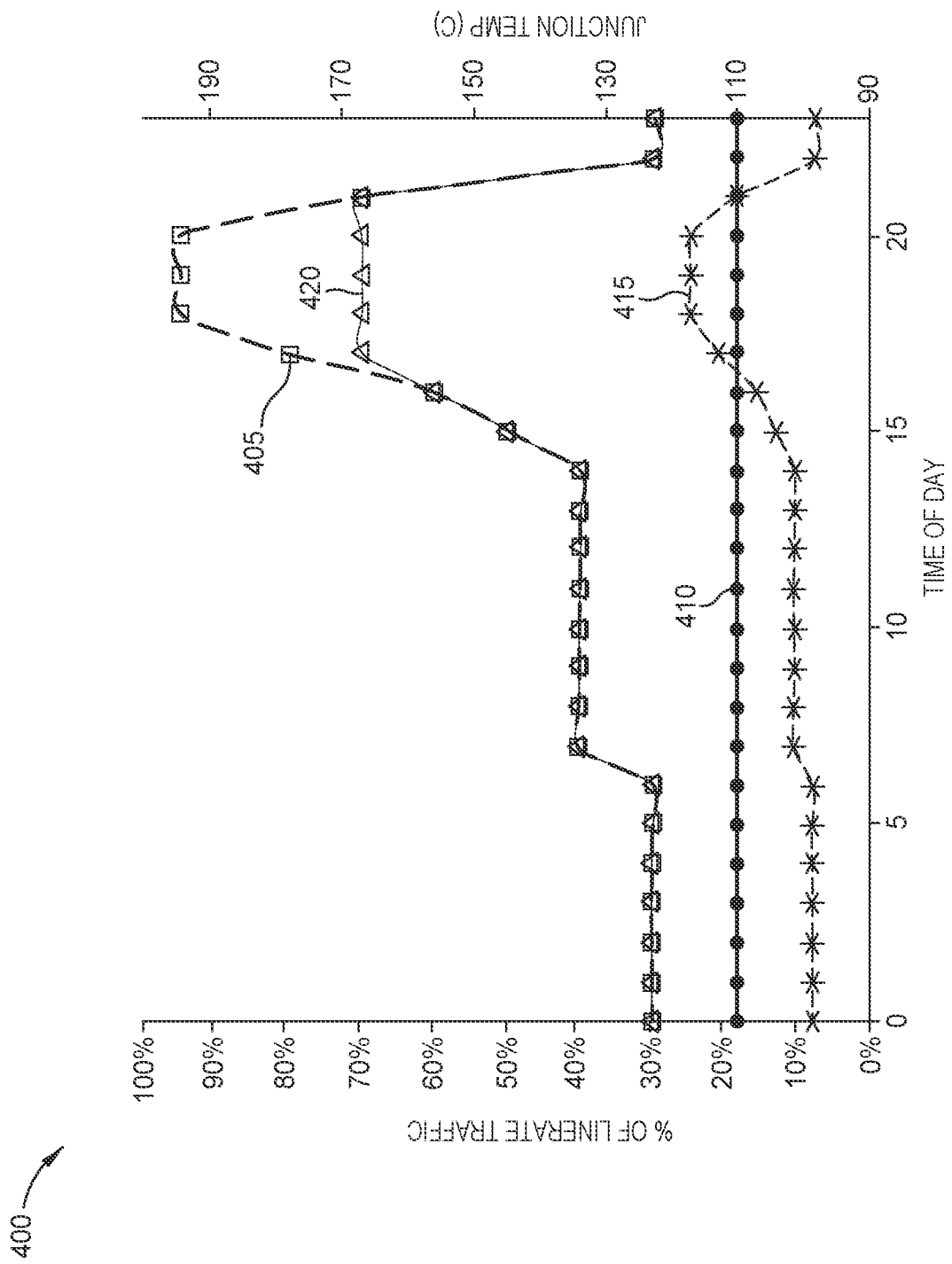
FIG. 4 is a chart illustrating some advantages of the cooling techniques described herein, according to one embodiment.

FIG. 4 is a chart 400 illustrating some advantages of the cooling techniques described herein, according to one embodiment. The X-axis of the chart 400 illustrates a 24-hour time period while the Y-axis indicates both the percentage (%) of linerate traffic and the junction temperature of a semiconductor chip. For example, if the percentage of linerate traffic is at 30%, that means the semiconductor chip is operating at 30% of its capacity. A 100% linerate traffic indicates the semiconductor chip is operating at its maximum capacity—i.e., maximum workload.

Plot 405 indicates the desired customer profile. Using a semiconductor chip in a network device as an example, the plot 405 which indicates the network traffic the semiconductor chip is asked to process over the 24-hour period. As shown, during the early morning hours (e.g., hours 0-5), the traffic being processed by the semiconductor chip is small (i.e., its workload is light). The plot 405 increases in the daytime hours from 7-14 but still remains well below the maximum capability of the semiconductor chip. However, from hours 14-20, the traffic sent to the semiconductor chip spikes and nearly reaches the maximum capability of the semiconductor chip. That is, assuming that the traffic is not throttled, during the hours of 18-20, the semiconductor chip works near its maximum capabilities.

Plot 410 indicates the maximum operating temperature of the semiconductor chip for the chip to reach its desired lifespan. For example, for the semiconductor chip to have a 10 year lifespan, the chip can be operated at a maximum of 110 degrees C. continuously. If the chip is ever above this temperature, it lifespan would be reduced to below 10 years.

However, due to changing workload and traffic profiles as illustrated by plot 405, the actual temperature of the semiconductor chip is likely not constant as shown by the plot 410. Instead, the actual junction temperature of the chip is illustrated by the plot 415. This plot 415 illustrates that the junction temperature is below the maximum junction temperature illustrated by the plot 410 from the hours 0-16. This is because the lower amount of traffic being processed by the semiconductor chip during this time period generates less heat in the semiconductor chip. However, between the hours 17-20, the junction temperature rises above the maximum temperature illustrated by the plot 415.

Using a cooling technique that evaluates only the current temperature to determine how to cool the semiconductor chip is illustrated by plot 420. So long as the junction temperature of the chip is below the maximum junction temperature shown by plot 410, this cooling technique permits the semiconductor chip to process all the received traffic. That is, the plot 420 matches the plot 405 for the hours 0-16 since the junction temperature shown by plot 415 is less than the maximum temperature in plot 410. However, between hours 17-20, the cooling technique determines that the junction temperature of plot 415 (e.g., the current temperature) exceeds the maximum temperature in plot 410, and in response, limits the amount of traffic that is processed by the semiconductor chip. For example, the cooling technique may use a shaper to reduce (or maintain) the workload of the semiconductor chip below the desired traffic profile shown in the plot 405 to cool the chip. Thus, plot 420 illustrates that the semiconductor chip is intentionally limited to only 70% of its maximum capabilities between the hours 17-20 to reduce the junction temperature to match (or at least be closer) to the maximum junction temperature of plot 410.

The disadvantage of the cooling technique illustrated by the plot 420 is that it does not consider the historical values of the junction temperature, but considers only the current junction temperature, when making its cooling decisions. The embodiments described above, however, determine an expected life of the semiconductor chip which is determined based on historical measurements. That is, the expected life may be based on the previous one, two, or three hours of temperature measurements. As seen in the chart 400, in the hours before the junction temperature in plot 415 exceeded the plot 410, the temperature was up to 12 degrees cooler than the maximum temperature. Thus, during those time periods, the lifespan of the semiconductor chip was being increased. For example, if the chip had a constant junction temperature of 100 degrees C., it might have a lifespan of 15 years rather than 10 year when operating at 110 C as illustrated by the plot 410.

The expected life considers past temperature measurements (when the temperature may be below the maximum junction temperature) to estimate the current life remaining of the chip. As such, when calculating the expected life at hour 17 when the current junction temperature is above the maximum junction temperature, the expected life may be above 10 years since the junction temperature was below the maximum junction temperature in the previous hours. Thus, a plot of the workload of the semiconductor chip when using cooling techniques that determine the expected life using historical measurement may be the same as the desired traffic profile shown by plot 405. That is, when using the expected life to take cooling actions, the cooling application may decide that no throttling is needed during the hours 17-20 which permits the semiconductor chip to operate near its maximum capacity thereby improving performance relative to the plot 420. Although the junction temperature in plot 415 rises above the maximum temperature in plot 410 during these hours, the expected life ensures that the estimated life still meets or exceeds the desired remaining life of the chip (e.g., the desired lifespan minus the runtime of the chip). Put differently, calculating the expected life using historical measurements permits the cooling application to track the increase to the lifespan of the chip which can then be used as a credit or offset during times when the junction temperature exceeds the temperature illustrated by the plot 410.

While not shown in chart 400, there may also be a maximum operational temperature (e.g., a maximum short term temperature) above the plot 410 which indicates a temperature the semiconductor chip should not exceed or it may immediately fail or generate errors. So long as the junction temperature remains below this maximum operational temperature, the cooling technique can control the cooling elements using the expected life calculation.

Figure 5:
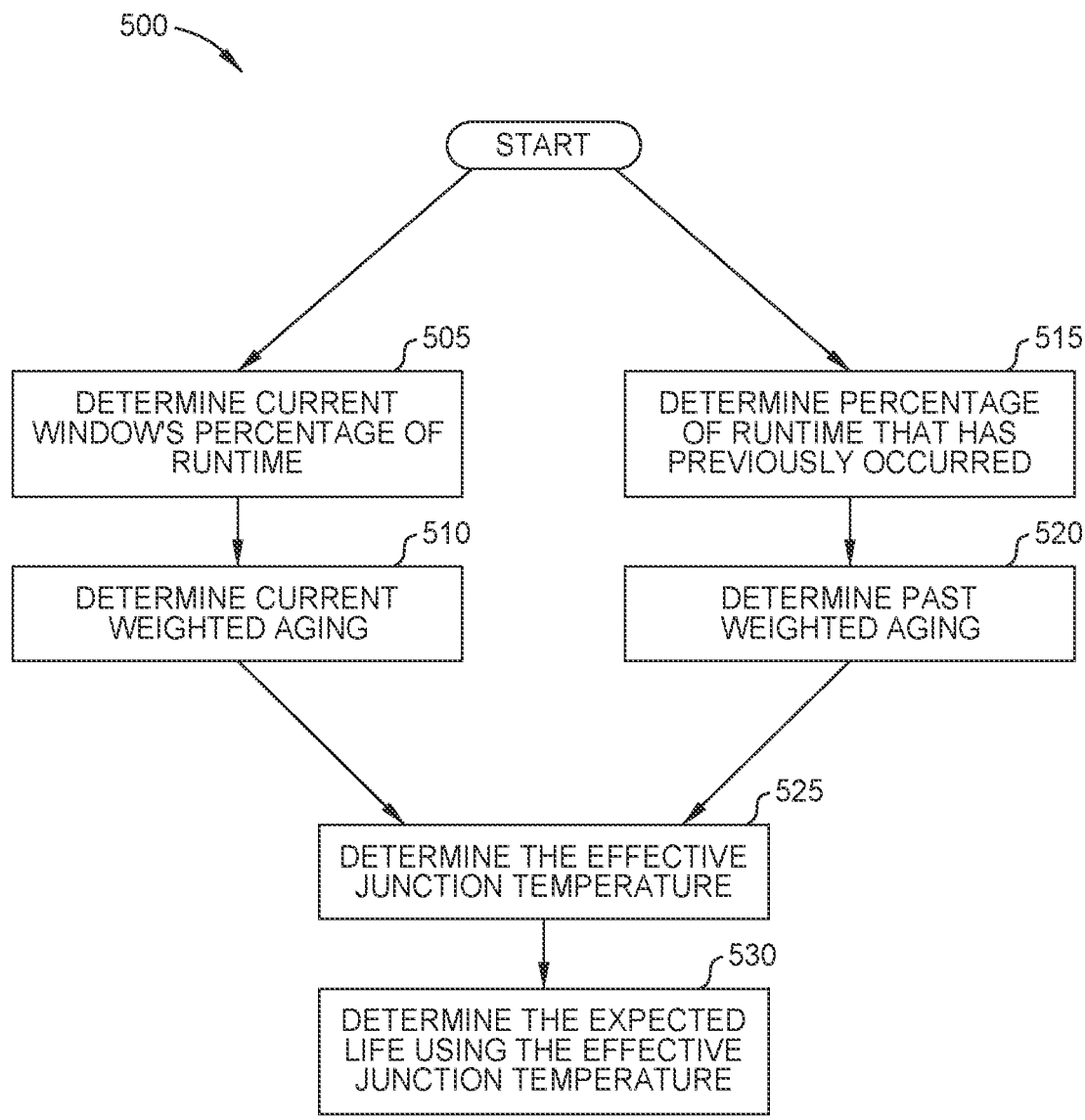
FIG. 5 is a flowchart for determining the expected life of a hardware device, according to one embodiment.

FIG. 5 is a flowchart of a method 500 for determining the expected life of a semiconductor chip (e.g. a hardware device), according to one embodiment. At block 505, the expected life calculator determines the current window's percentage of runtime. For example, if the window includes the past one minute of temperature measurements, the calculator determines the percentage of time that one minute is of the total time the semiconductor chip has been operating (e.g., 1/total hours of operation). However, the size of the window can be greater than, or smaller than, one minute. Different size windows may be better for different situations (e.g., depending on how quickly the temperature changes in the chip or how much the temperature fluctuates).

At block 510, the calculator determines the current weighted aging. In one embodiment, the expected life calculator uses the Arrhenius equation to determine the current weighted aging. To do so, the current window's percentage is used in the Arrhenius equation along with the current temperature measurements in the corresponding window to determine the current weighted aging.

Along with performing blocks 505 and 510, at block 515 the expected life calculator determines the percentage of runtime that has previously occurred. That is, excluding the current time window, the calculator determines the percentage of runtime that has already occurred. For example, if at block 505 the current window's percentage of the runtime is 3%, then the percentage of runtime calculated at block 515 is 97%.

At block 520, the calculator determines past weighted aging. In one embodiment, the percentage of the runtime that has previously occurred is used in the Arrhenius equation to determine the past weighted aging. To do so, the percentage of the runtime that has previously occurred is used in the Arrhenius equation along with the historical temperature measurements (e.g., all the temperature measurements captured during its runtime) to determine the past weighted aging.

At block 525, the expected life calculator determines the effective junction temperature using the current weighted aging and the past weighted aging. In one embodiment, the Arrhenius equation is again used, along with both the current and past weighted aging values, to determine the effective junction temperature of the semiconductor chip based on the history of temperatures that the semiconductor chip has seen.

At block 530, the expected life calculator determines the expected life using the effective junction temperature. In one embodiment, the effective junction temperature is inserted into the Arrhenius equation which results in the expected life of the semiconductor chip.

In one embodiment, the method 500 is based on predicting expected life of the semiconductor chip by using the Arrhenius equation to predict when metal electro-migration causes the chip to fail. However, the expected life can also be determined using other causes of failure such as bias temperature instability (BTI) (either negative bias or positive bias), and hot-carrier injection (HCI). Different techniques or formulas (either different from the Arrhenius equation, or modifications to the Arrhenius equation) can be used to predict the expected life when considering these other causes of failure. For example, the Arrhenius equation can be used to calculate expected life of BTI and HCI using different activation energies. Calculating expected life for BTI and HCI may be similar to EM where the only significant variable is temperatures (assuming other variables are not changed such as voltage). In one embodiment, these techniques are temperature dependent with a logarithmic dependence on temperature.

The method 500 is just one technique for generating the expected life. In one embodiment, the Arrhenius equation is still used to calculate the expected life, but the activation energy is no longer constant and is a function of temperature. Thus, the lifetime dependence is no longer logarithmic. In another technique, the expected life calculator can determine a running average of the historical temperature measurements. The running average and the total runtime of the hardware device can be used to index into a look up table to estimate the expected life. Or the cooling application can calculate the expected life at different intervals based on a window of time measurements and average these expected life calculations to generate an overall estimate of the expected life.

The method 500 can repeat according to the time window (e.g., every minute), where the temperature measurement captured during the previous time window are added to the historical temperature measurements and a new set of current temperature measurements are captured in the next window.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

As will be appreciated by one skilled in the art, the embodiments disclosed herein may be embodied as a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a computer program product embodied in one or more computer readable medium(s) having computer readable program code embodied thereon.

Program code embodied on a computer readable medium may be transmitted using any appropriate medium, including but not limited to wireless, wireline, optical fiber cable, RF, etc., or any suitable combination of the foregoing.

Computer program code for carrying out operations for embodiments of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described herein with reference to flowchart illustrations and/or block diagrams of methods, apparatuses (systems), and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the block(s) of the flowchart illustrations and/or block diagrams.

These computer program instructions may also be stored in a computer readable medium that can direct a computer, other programmable data processing apparatus, or other device to function in a particular manner, such that the instructions stored in the computer readable medium produce an article of manufacture including instructions which implement the function/act specified in the block(s) of the flowchart illustrations and/or block diagrams.

The computer program instructions may also be loaded onto a computer, other programmable data processing apparatus, or other device to cause a series of operational steps to be performed on the computer, other programmable apparatus or other device to produce a computer implemented process such that the instructions which execute on the computer, other programmable data processing apparatus, or other device provide processes for implementing the functions/acts specified in the block(s) of the flowchart illustrations and/or block diagrams.

The flowchart illustrations and block diagrams in the Figures illustrate the architecture, functionality, and operation of possible implementations of systems, methods, and computer program products according to various embodiments. In this regard, each block in the flowchart illustrations or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

In view of the foregoing, the scope of the present disclosure is determined by the claims that follow.

We claim:

1. A method, comprising:
   determining an expected life of a hardware device in a computing system based on a plurality of historical temperature measurements and a current temperature measurement;

determining a desired remaining life of the hardware device by subtracting a total runtime from a desired lifespan of the hardware device;

comparing the expected life to the desired remaining life of the hardware device; and upon determining the expected life is less than the desired remaining life, decreasing a temperature of the hardware device by changing an operating parameter of a cooling element in the computing system.

2. The method of claim 1, wherein the expected life is an estimate of time remaining before the hardware device is predicted to fail.

3. The method of claim 1, wherein the desired lifespan is a desired time the hardware device should last before failing.

4. The method of claim 1, further comprising, after decreasing the temperature of the hardware device:

determining an updated value of the expected life using the plurality of historical temperature measurements and an updated current temperature measurement; and upon determining the updated value of the expected life is greater than the desired remaining life, increasing the temperature of the hardware device by changing the operating parameter of the cooling element, wherein the operating parameter adjusts an amount of cooling performed by the cooling element.

5. The method of claim 4, further comprising, before increasing the temperature of the hardware device:

determining that a timeout value has expired, wherein the timeout value prevents a cooling application from increasing the temperature for a predefined period of time.

6. The method of claim 5, further comprising, before increasing the temperature of the hardware device:

upon determining that the timeout value has not expired, maintaining the operating parameter of the cooling element at a current value set when decreasing the temperature of the hardware device.

7. The method of claim 1, wherein determining the expected life of the hardware device comprises:

determining an effective temperature of the hardware device based on the Arrhenius equation and the plurality of historical temperature measurements.

8. The method of claim 1, wherein determining the expected life of the hardware device comprises:

determining an effective temperature of the hardware device using a technique that predicts failure caused by at least one of metal electro-migration, negative-bias temperature instability (NBTI), or hot-carrier injection (HCI).

9. A non-transitory computer readable medium having program instructions embodied therewith, the program instructions executable by a processor to perform an operation, the operation comprising:

determining an expected life of a hardware device in a computing system based on a plurality of historical temperature measurements and a current temperature measurement;

determining a desired remaining life of the hardware device by subtracting a total runtime from a desired lifespan of the hardware device;

comparing the expected life to the desired remaining life of the hardware device; and upon determining the expected life is less than the desired remaining life, decreasing a temperature of the hardware device by changing an operating parameter of a cooling element in the computing system.

10. The non-transitory computer readable medium of claim 9, wherein the expected life is an estimate of time remaining before the hardware device is predicted to fail.

11. The non-transitory computer readable medium of claim 9, wherein the desired lifespan is a desired time the hardware device should last before failing.

12. The non-transitory computer readable medium of claim 9, wherein the operation further comprises, after decreasing the temperature of the hardware device:

determining an updated value of the expected life using the plurality of historical temperature measurements and an updated current temperature measurement; and upon determining the updated value of the expected life is greater than the desired remaining life, increasing the temperature of the hardware device by changing the operating parameter of the cooling element.

13. The non-transitory computer readable medium of claim 12, wherein the operation further comprises, before increasing the temperature of the hardware device:

determining that a timeout value has expired, wherein the timeout value prevents a cooling application from increasing the temperature for a predefined period of time.

14. The non-transitory computer readable medium of claim 13, wherein the operation further comprises, before increasing the temperature of the hardware device:

upon determining that the timeout value has not expired, maintaining the operating parameter of the cooling element at a current value set when decreasing the temperature of the hardware device.

15. A cooling system, comprising:

a physical cooling element; and a cooling application configured to:

determine an expected life of a hardware device based on a plurality of historical temperature measurements and a current temperature measurement;

determine a desired remaining life of the hardware device by subtracting a total runtime from a desired lifespan of the hardware device;

compare the expected life to the desired remaining life of the hardware device; and upon determining the expected life is less than the desired remaining life, decrease a temperature of the hardware device by changing an operating parameter of the physical cooling element.

16. The cooling system of claim 15, wherein the expected life is an estimate of time remaining before the hardware device is predicted to fail.

17. The cooling system of claim 15, wherein the desired lifespan is a desired time the hardware device should last before failing.

18. The cooling system of claim 15, wherein the cooling application is configured to, after decreasing the temperature of the hardware device:

determine an updated value of the expected life using the plurality of historical temperature measurements and an updated current temperature measurement; and upon determining the updated value of the expected life is greater than the desired remaining life, increase the temperature of the hardware device by changing the operating parameter of the physical cooling element.

19. The cooling system of claim 18, wherein the cooling application is configured to, before increasing the temperature of the hardware device:

determine that a timeout value has expired, wherein the timeout value prevents the cooling application from increasing the temperature for a predefined period of time.

20. The cooling system of claim 19, wherein the cooling application is configured to, before increasing the temperature of the hardware device:

upon determining that the timeout value has not expired, maintain the operating parameter of the physical cooling element at a current value set when decreasing the temperature of the hardware device.

\* \* \* \* \*